US006509672B2

(12) United States Patent
Rueger et al.

(10) Patent No.: US 6,509,672 B2
(45) Date of Patent: Jan. 21, 2003

(54) METHOD AND APPARATUS FOR CHARGING A PIEZOELECTRIC ELEMENT

(75) Inventors: Johannes-Jörg Rueger, Vaihingen/enz (DE); Patrick Mattes, Stuttgart (DE); Alexander Hock, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/824,154

(22) Filed: Apr. 2, 2001

(65) Prior Publication Data

US 2001/0028204 A1 Oct. 11, 2001

(30) Foreign Application Priority Data

Apr. 1, 2000 (EP) .......................................... 00106963

(51) Int. Cl.[7] ............................................. H01L 41/09
(52) U.S. Cl. ............................................. 310/316.03
(58) Field of Search ...................................... 310/316.03

(56) References Cited

U.S. PATENT DOCUMENTS 4,637,261 A * 1/1987 Kraus et al. .................. 73/118
6,081,062 A * 6/2000 Hommann et al. .... 310/316.03
6,276,337 B1 * 8/2001 Minato ....................... 123/501

FOREIGN PATENT DOCUMENTS

| | | | |
|---|---|---|---|
| DE | 197 29 844 | 1/1999 | F02M/51/00 |
| DE | 197 42073 | 3/1999 | F02B/3/00 |
| EP | 0 371 469 | 6/1990 | H01L/41/04 |
| EP | 0 379 182 | 7/1990 | F02M/51/00 |
| EP | 0 971 115 | 1/2000 | F02D/41/40 |
| EP | 1 138 914 A1 * | 4/2001 | F02D/41/20 |
| JP | 09 256925 | 9/1997 | F02M/47/00 |
| JP | 10 176624 | 6/1998 | F02D/41/20 |
| JP | 2000-027689 * | 1/2000 | F02D/41/14 |
| WO | 97/02096 * | 6/1998 | H01L/41/04 |
| WO | 97/02905 * | 6/1998 | H01L/41/04 |
| WO | 98/01155 * | 12/1998 | F02D/41/20 |

* cited by examiner

*Primary Examiner*—Thomas M. Dougherty
(74) *Attorney, Agent, or Firm*—Kenyon & Kenyon

(57) ABSTRACT

The invention describes a method and an apparatus for charging a piezoelectric element of a fuel injection system for, for example, an internal combustion engine. The apparatus is characterized in that the piezoelectric element is activated by an activation voltage having a value set as a function of measured fuel pressure in the fuel injection system.

20 Claims, 7 Drawing Sheets

METHOD AND APPARATUS FOR CHARGING A PIEZOELECTRIC ELEMENT

The present invention relates to an apparatus as defined in the preamble of claim 1, and a method as defined in the preamble of claim 5, i.e. a method and an apparatus for charging a piezoelectric element.

The present piezoelectric elements being considered in more detail are, in particular but not exclusively, piezoelectric elements used as actuators. Piezoelectric elements can be used for such purposes because, as is known, they possess the property of contracting or expanding as a function of a voltage applied thereto or occurring therein.

The practical implementation of actuators using piezoelectric elements proves to be advantageous in particular if the actuator in question must perform rapid and/or frequent movements.

The use of piezoelectric elements as actuators proves to be advantageous, inter alia, in fuel injection nozzles for internal combustion engines. Reference is made, for example, to EP 0 371 469 B1 and to EP 0 379 182 B1 regarding the usability of piezoelectric elements in fuel injection nozzles.

Piezoelectric elements are capacitative elements which, as already partially alluded to above, contract and expand in accordance with the particular charge state or the voltage occurring therein or applied thereto. In the example of a fuel injection nozzle, expansion and contraction of piezoelectric elements is used to control valves that manipulate the linear strokes of injection needles. The use of piezoelectric elements with double acting, double seat valves to control corresponding injection needles in a fuel injection system is shown in German patent applications DE 197 42 073 A1 and DE 197 29 844 A1, which are incorporated by reference herein in their entirety.

Fuel injection systems using piezoelectric actuators are characterized by the fact that, to a first approximation, piezoelectric actuators exhibit a proportional relationship between applied voltage and the linear expansion. In a fuel injection nozzle, for example, implemented as a double acting, double seat valve to control the linear stroke of a needle for fuel injection into a cylinder of an internal combustion engine, the amount of fuel injected into a corresponding cylinder is a function of the time the valve is open, and in the case of the use of a piezoelectric element, the activation voltage applied to the piezoelectric element.

FIG. 8 is a schematic representation of a fuel injection system using a piezoelectric element 2010 as an actuator. Referring to FIG. 8, the piezoelectric element 2010 is electrically energized to expand and contract in response to a given activation voltage. The piezoelectric element 2010 is coupled to a piston 2015. In the expanded state, the piezoelectric element 2010 causes the piston 2015 to protrude into a hydraulic adapter 2020 which contains a hydraulic fluid, for example fuel. As a result of the piezoelectric element's expansion, a double acting control valve 2025 is hydraulically pushed away from hydraulic adapter 2020 and the valve plug 2035 is extended away from a first closed position 2040. The combination of double acting control valve 2025 and hollow bore 2050 is often referred to as double acting, double seat valve for the reason that when piezoelectric element 2010 is in an unexcited state, the double acting control valve 2025 rests in its first closed position 2040. On the other hand, when the piezoelectric element 2010 is fully extended, it rests in its second closed position 2030. The later position of valve plug 2035 is schematically represented with ghost lines in FIG. 8.

The fuel injection system comprises an injection needle 2070 allowing for injection of fuel from a pressurized fuel supply line 2060 into the cylinder (not shown). When the piezoelectric element 2010 is unexcited or when it is fully extended, the double acting control valve 2025 rests respectively in its first closed position 2040 or in its second closed position 2030. In either case, the hydraulic rail pressure maintains injection needle 2070 at a closed position. Thus, the fuel mixture does not enter into the cylinder (not shown). Conversely, when the piezoelectric element 2010 is excited such that double acting control valve 2025 is in the so-called mid-position with respect to the hollow bore 2050, then there is a pressure drop in the pressurized fuel supply line 2060. This pressure drop results in a pressure differential in the pressurized fuel supply line 2060 between the top and the bottom of the injection needle 2070 so that the injection needle 2070 is lifted allowing for fuel injection into the cylinder (not shown).

In a fuel injection system it is the goal to achieve a desired fuel injection volume with high accuracy, especially at small injection volumes, for example during pre-injection. In the example of a double seat valve, the piezoelectric element is to be expanded or contracted by the effect of an activation voltage so that a controlled valve plug is positioned midway between the two seats of the double seat valve to position the corresponding injection needle for maximum fuel flow during a set time period. It has proven to be difficult to determine and apply an activation voltage with sufficient precision such that the corresponding valve plug is accurately positioned for maximum fuel flow.

It is therefore an object of the present invention to develop the apparatus as defined in the preamble of claim 1 and the method as defined in the preamble of claim 5 in such a way that an activation voltage level for a piezoelectric element is determined and set with sufficient precision to accurately position a valve plug for maximum fuel flow. The piezoelectric element can be one of several piezoelectric elements used as actuators in a system such as, for example, a fuel injection system.

This object is achieved, according to the present invention, by way of the features claimed in the characterizing portion of claim 1 (apparatus) and in the characterizing portion of claim 5 (method).

These provide for:

- an activation voltage value for charging the piezoelectric element to be set as a function of a measured operating characteristic of the fuel injection system (characterizing portion of claim 1); and for
- a definition to be made, prior to charging, as to a value for an activation voltage for charging the piezoelectric element, as a function of a measured operating characteristic of the fuel injection system (characterizing portion of claim 5).

The amount of force needed to move the valve needle is a function of the operating characteristics of the fuel injection system, for example, the fuel pressure applied to the control valve at the fuel injection nozzle, temperature, and so on. Thus, the load on the piezoelectric element from the corresponding valve, and the amount of displacement of the actuator in response to application of a particular activation voltage are also a function of, for example, the fuel pressure applied to the valve.

In the case of a common rail fuel injection system, the fuel pressure at any particular fuel injection for a cylinder will be approximately equal to the fuel pressure in the common rail. The common rail fuel pressure acting upon the valves of an internal combustion engine can change significantly as a function of the working point within the fuel injection system, resulting in considerable changes in the forces acting upon the valve.

Accordingly, in this example, the activation voltage level for a piezoelectric element, suitable for displacement of the element sufficient to move the injection needle to an optimum midway position for maximum fuel flow, in the example of a double acting valve, is influenced by fuel pressure levels and changes in the level.

Given an activation voltage level set as a function of an operating characteristic of the fuel injection system such as, for example, fuel pressure, the control valve can be controlled with sufficient accuracy independently of the rail pressure, and therefore of the operating state of the system. The activation voltage applied to a piezoelectric element at any particular time will be appropriate relative to the rail pressure at the time of activation, so that the injection needle is properly positioned by the control valve for maximum injection volume. In this manner, a desired injection volume can be achieved with sufficient accuracy even if the injection volume is small or the injection profile complex.

Advantageous developments of the present invention are evident from the dependent claims, the description below, and the Figures.

The invention will be explained below in more detail with reference to exemplary embodiments, referring to the figures in which.

Figure 1:
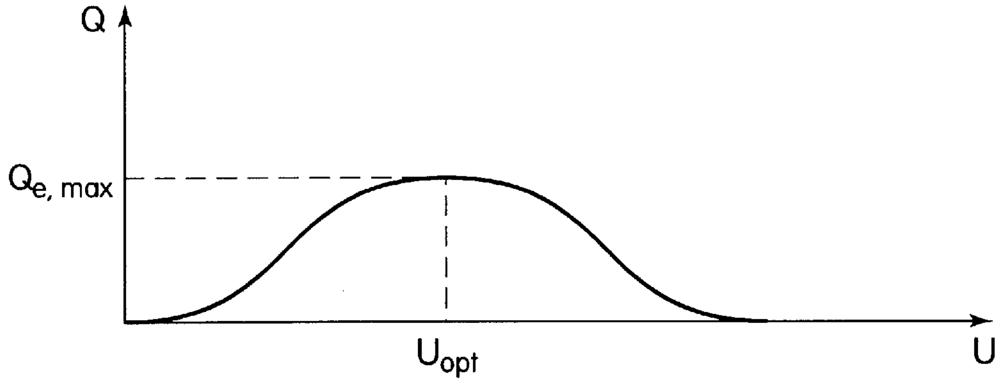
FIG. 1 shows a graph depicting the relationship between activation voltage and injected fuel volume in a fixed time period for the example of a double acting control valve.

FIG. 1 shows a graph depicting the relationship between activation voltage U and injected fuel volume Q during a preselected fixed time period, for an exemplary fuel injection system using piezoelectric element acting upon double seat control valves. The y-axis represents volume of fuel injected into a cylinder chamber during the preselected fixed period of time. The x-axis represents the activation voltage applied to or stored in the corresponding piezoelectric element, used to displace a valve plug of the double acting control valve.

At x=0, y=0, the activation voltage U is zero, and the valve plug is seated in a first closed position to prevent the flow of fuel during the preselected fixed period of time. For values of the activation voltage greater than zero, up to the x-axis point indicated as $U_{opt}$, the represented values of the activation voltage U cause the displacement of the valve plug away from the first seat and towards the second seat, in a manner that results in a greater volume of injected fuel for the fixed time period, as the activation voltage approaches $U_{opt}$, up to the value for volume indicated on the y-axis by $Q_{e,max}$. The point $Q_{e,max}$ corresponding to the greatest volume for the injected fuel during the fixed period of time, represents the value of the activation voltage for application to or charging of the piezoelectric element, that results in a displacement of the valve plug to a position midway between the first and second valve seats.

As shown on the graph of FIG. 1, for values of the activation voltage greater than $U_{opt}$, the volume of fuel injected during the fixed period of time decreases until it reaches zero. This represents displacement of the valve plug from the midway point and toward the second seat of the double seat valve until the valve plug is seated against the second closed position. Thus, the graph of FIG. 1 illustrates that a maximum volume of fuel injection occurs when the activation voltage U causes the piezoelectric element to displace the valve plug to the midway point.

The present invention teaches that the value for $U_{opt}$ at any given time is influenced by the operating characteristics of the fuel injection system at that time, such as for example, fuel pressure. That is, the amount of displacement caused by the piezoelectric element for a certain activation voltage varies as a function of the fuel pressure. Accordingly, in order to achieve a maximum volume of fuel injection, $Q_{e,max}$, during a given fixed period of time, the activation voltage U applied to or occurring in the piezoelectric element should be set to a value relevant to a current fuel pressure, to achieve $U_{opt}$.

Figure 2A:
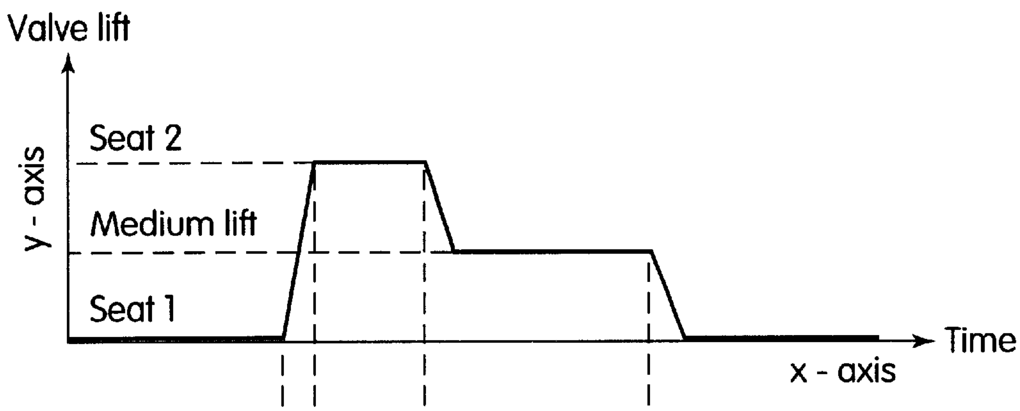
FIGS. 2A and 2B show a schematic profile of an exemplary control valve stroke and the corresponding injection needle lift.
Figure 2B:
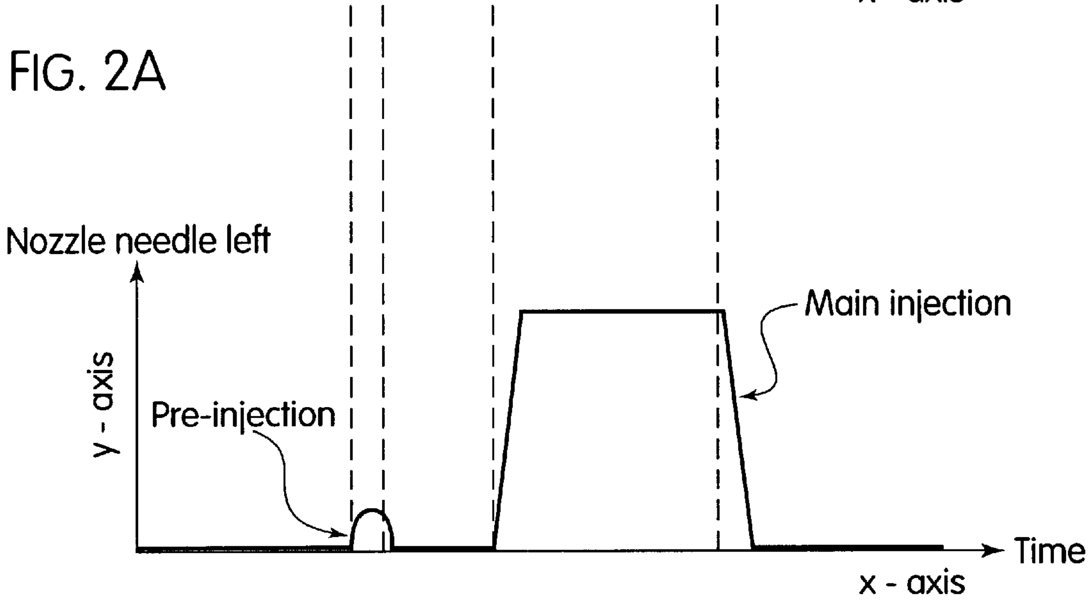

FIGS. 2A and 2B show a double graph representing a schematic profile of an exemplary control valve stroke, to illustrate the double acting control valve operation discussed above. In the upper graph of FIG. 2A, the x-axis represents time, and the y-axis represents displacement of the valve plug (valve lift). In the lower graph of FIG. 2B, the x-axis once again represents time, while the y-axis represents a injection needle lift to provide fuel flow, resulting from the valve lift of the graph of FIG. 2A. The graphs of FIGS. 2A and 2B are aligned with one another to coincide in time, as represented by the respective x-axises.

During an injection cycle, the piezoelectric element is charged resulting in an expansion of the piezoelectric element, as will be described in greater detail, and causing the corresponding valve plug to move from the first seat to the second seat for a pre-injection stroke, as shown in the graph of FIG. 2A. The graph of FIG. 2B shows a small injection of fuel that occurs as the valve plug moves between the two seats of the double seat valve, opening and closing the valve as the plug moves between the seats. In general, there can be a first charging process to move the valve from the first seat to midway position, then a pause, and then a second charging process to move the valve from the midway position to the second seat.

After a preselected period of time, a discharging operation is then performed, as will be explained in greater detail below, to reduce the charge within the piezoelectric element so that it contracts, as will also be described in greater detail, causing the valve plug to move away from the second seat, and hold at a midway point between the two seats. As indicated in FIG. 1, the activation voltage within the piezoelectric element is to reach a value that equals $U_{opt}$ to correspond to a midway point, and thereby obtain a maximum fuel flow, $Q_{e,max}$, during the period of time allocated to a main injection. The graphs of FIGS. 2A and 2B show the holding of the valve lift at a midway point, resulting in a main fuel injection.

At the end of the period of time for the main injection, the piezoelectric element is discharged to an activation voltage of zero, resulting in further contraction of the piezoelectric element, to cause the valve plug to move away from the midway position, toward and to the first seat, closing the valve and stopping fuel flow, as shown in the graphs of FIGS. 2A and 2B. At this time, the valve plug will once again be in a position to repeat another pre-injection, main injection cycle, as just described above.

Figure 3A:
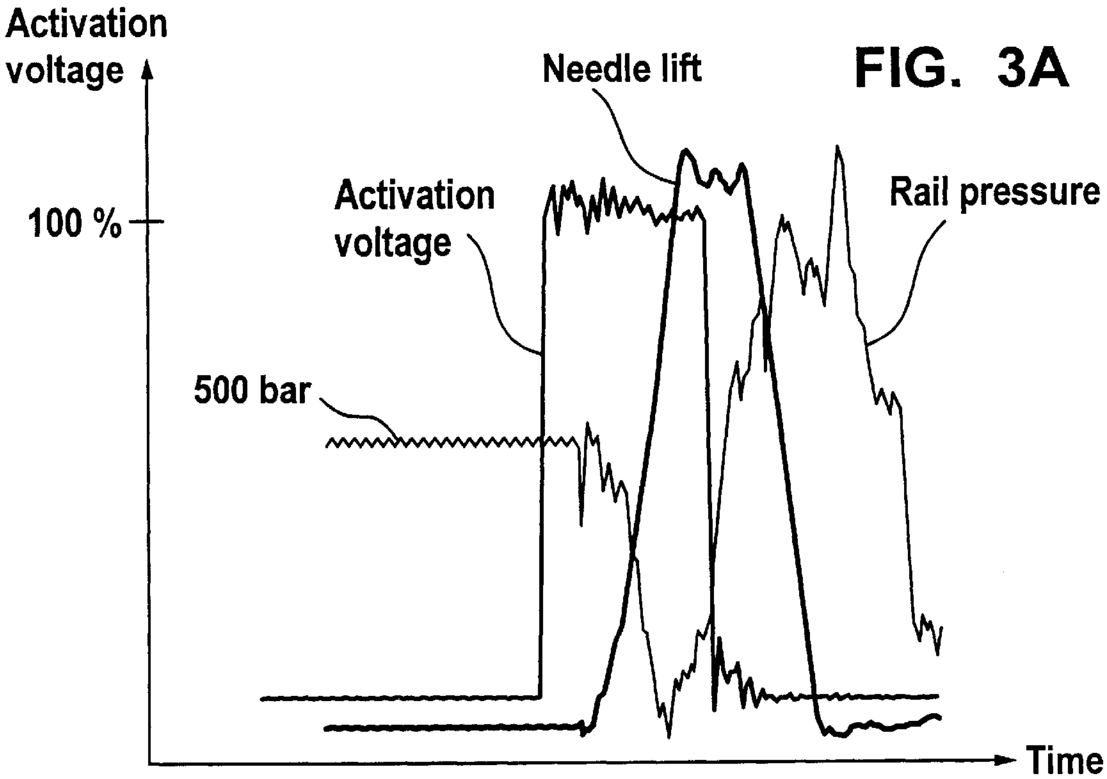
FIG. 3A shows graphs illustrating the relationship between activation voltage and rail pressure.
Figure 3B:
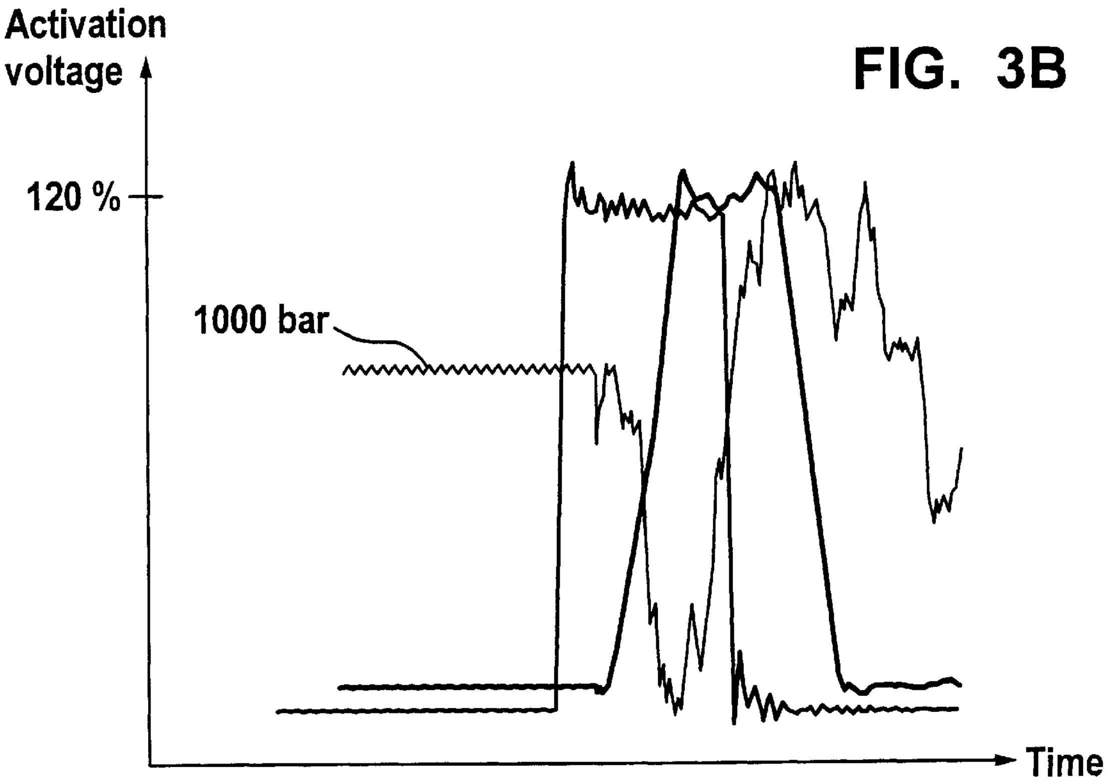
FIG. 3B shows graphs illustrating the relationship between activation voltage and rail pressure.

FIG. 3A and FIG. 3B show examples of graphs that illustrate the relationship between activation voltage and rail pressure, during an injection, where the valve is moved from a first seat to a midway position and, after a certain time, the valve is moved back to the first seat by charging and discharging the piezoelectric element. The graphs of FIG. 3A and FIG. 3B show an activation voltage over time which is applied to a piezoelectric element, the displacement of the injection needle, resulting from the expansion or contraction of the piezoelectric element due to the activation voltage, and the fuel pressure in the common rail. As can be seen, the optimal activation voltage differs due to variations of the rail pressure being 500 bar and 1000 bar, respectively.

Figure 4:
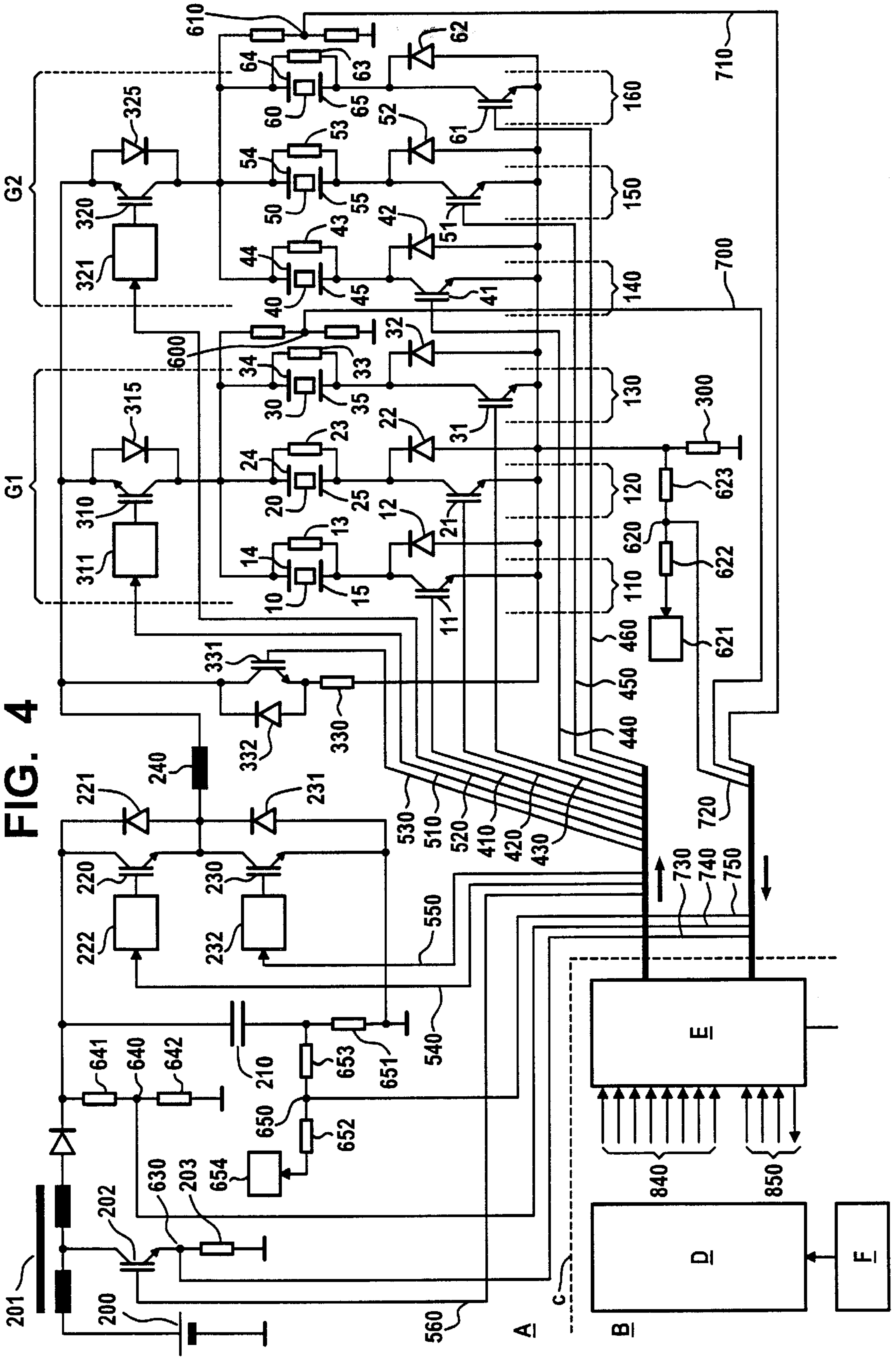
FIG. 4 shows a block diagram of an exemplary embodiment of an arrangement in which the present invention may be implemented.

FIG. 4 provides a block diagram of an exemplary embodiment of an arrangement in which the present invention may be implemented.

In FIG. 4 there is a detailed area A and a non-detailed area B, the separation of which is indicated by a dashed line c. The detailed area A comprises a circuit for charging and discharging piezoelectric elements 10, 20, 30, 40, 50 and 60. In the example being considered these piezoelectric elements 10, 20, 30, 40, 50 and 60 are actuators in fuel injection nozzles (in particular in so-called common rail injectors) of an internal combustion engine. Piezoelectric elements can be used for such purposes because, as is known, and as discussed above, they possess the property of contracting or expanding as a function of a voltage applied thereto or occurring therein. The reason to take six piezoelectric elements 10, 20, 30, 40, 50 and 60 in the embodiment described is to independently control six cylinders within a combustion engine; hence, any other number of piezoelectric elements might match any other purpose.

The non-detailed area B comprises a control unit D and a activation IC E by both of which the elements within the detailed area A are controlled, as well as measuring system F for measuring system operating characteristics such as, for example, rail pressure. According to the present invention, the control unit D and activation IC E are programmed to control activation voltages for piezoelectric elements as a function of measured or sensed values of operating characteristics of the fuel injection system, as for example, fuel pressure of a common rail system sensed by the measuring system F.

The following description firstly introduces the individual elements within the detailed area A. Then, the procedures of charging and discharging piezoelectric elements 10, 20, 30, 40, 50, 60 are described in general. Finally, the ways both procedures are controlled by means of control unit D and activation IC E are described in detail.

The circuit within the detailed area A comprises six piezoelectric elements 10, 20, 30, 40, 50 and 60.

The piezoelectric elements 10, 20, 30, 40, 50 and 60 are distributed into a first group G1 and a second group G2, each comprising three piezoelectric elements (i.e. piezoelectric elements 10, 20 and 30 in the first group G1 resp. 40, 50 and 60 in the second group G2). Groups G1 and G2 are constituents of circuit parts connected in parallel with one another. Group selector switches 310, 320 can be used to establish which of the groups G1, G2 of piezoelectric elements 10, 20 and 30 resp. 40, 50 and 60 will be discharged in each case by a common charging and discharging apparatus (however, the group selector switches 310, 320 are meaningless for charging procedures, as is explained in further detail below).

The group selector switches 310, 320 are arranged between a coil 240 and the respective groups G1 and G2 (the coil-side terminals thereof) and are implemented as transistors. Side drivers 311, 321 are implemented which transform control signals received from the activation IC E into voltages which are eligible for closing and opening the switches as required.

Diodes 315 and 325 (referred to as group selector diodes), respectively, are provided in parallel with the group selector switches 310, 320. If the group selector switches 310, 320 are implemented as MOSFETs or IGBTs for example, these group selector diodes 315 and 325 can be constituted by the parasitic diodes themselves. The diodes 315, 325 bypass the group selector switches 310, 320 during charging procedures. Hence, the functionality of the group selector switches 310, 320 is reduced to select a group G1, G2 of piezoelectric elements 10, 20 and 30, resp. 40, 50 and 60 for a discharging procedure only.

Within each group G1 resp. G2 the piezoelectric elements 10, 20 and 30, resp. 40, 50 and 60 are arranged as constituents of piezo branches 110, 120 and 130 (group G1) and 140, 150 and 160 (group G2) that are connected in parallel. Each piezo branch comprises a series circuit made up of a first parallel circuit comprising a piezoelectric element 10, 20, 30, 40, 50 resp. 60 and a resistor 13, 23, 33, 43, 53 resp. 63 (referred to as branch resistors) and a second parallel circuit made up of a selector switch implemented as a transistor 11, 21, 31, 41, 51 resp. 61 (referred to as branch selector switches) and a diode 12, 22, 32, 42, 52 resp. 62 (referred to as branch diodes).

The branch resistors 13, 23, 33, 43, 53 resp. 63 cause each corresponding piezoelectric element 10, 20, 30, 40, 50 resp. 60 during and after a charging procedure to continuously discharge themselves, since they connect both terminals of each capacitive piezoelectric element 10, 20, 30, 40, 50, resp. 60 one to another. However, the branch resistors 13, 23, 33, 43, 53 resp. 63 are sufficiently large to make this procedure slow compared to the controlled charging and discharging procedures as described below. Hence, it is still a reasonable assumption to consider the charge of any piezoelectric element 10, 20, 30, 40, 50 or 60 as unchanging within a relevant time after a charging procedure (the reason to nevertheless implement the branch resistors 13, 23, 33, 43, 53 and 63 is to avoid remaining charges on the piezoelectric elements 10, 20, 30, 40, 50 and 60 in case of a breakdown of the system or other exceptional situations). Hence, the branch resistors 13, 23, 33, 43, 53 and 63 may be neglected in the following description.

The branch selector switch/branch diode pairs in the individual piezo branches 110, 120, 130, 140, 150 resp. 160, i.e. selector switch 11 and diode 12 in piezo branch 110, selector switch 21 and diode 22 in piezo branch 120, and so on, can be implemented using electronic switches (i.e. transistors) with parasitic diodes, for example MOSFETs or IGBTs (as stated above for the group selector switch/diode pairs 310 and 315 resp. 320 and 325).

The branch selector switches 11, 21, 31, 41, 51 resp. 61 can be used to establish which of the piezoelectric elements 10, 20, 30, 40, 50 or 60 will be charged in each case by a common charging and discharging apparatus: in each case, the piezoelectric elements 10, 20, 30, 40, 50 or 60 that are charged are all those whose branch selector switches 11, 21, 31, 41, 51 or 61 are closed during the charging procedure which is described below. Usually, at any time only one of the branch selector switches is closed.

The branch diodes 12, 22, 32, 42, 52 and 62 serve for bypassing the branch selector switches 11, 21, 31, 41, 51 resp. 61 during discharging procedures. Hence, in the example considered for charging procedures any individual piezoelectric element can be selected, whereas for discharging procedures either the first group G1 or the second group G2 of piezoelectric elements 10, 20 and 30 resp. 40, 50 and 60 or both have to be selected.

Returning to the piezoelectric elements 10, 20, 30, 40, 50 and 60 themselves, the branch selector piezo terminals 15, 25, 35, 45, 55 resp. 65 may be connected to ground either through the branch selector switches 11, 21, 31, 41, 51 resp. 61 or through the corresponding diodes 12, 22, 32, 42, 52 resp. 62 and in both cases additionally through resistor 300.

The purpose of resistor 300 is to measure the currents that flow during charging and discharging of the piezoelectric elements 10, 20, 30, 40, 50 and 60 between the branch selector piezo terminals 15, 25, 35, 45, 55 resp. 65 and the ground. A knowledge of these currents allows a controlled charging and discharging of the piezoelectric elements 10, 20, 30, 40, 50 and 60. In particular, by closing and opening charging switch 220 and discharging switch 230 in a manner dependent on the magnitude of the currents, it is possible to set the charging current and discharging current to predefined average values and/or to keep them from exceeding or falling below predefined maximum and/or minimum values as is explained in further detail below.

In the example considered, the measurement itself further requires a voltage source 621 which supplies a voltage of 5 V DC for example and a voltage divider implemented as two resistors 622 and 623. This is in order to prevent the activation IC E (by which the measurements are performed) from negative voltages which might otherwise occur on measuring point 620 and which cannot be handled be means of activation IC E: such negative voltages are changed into positive voltages by means of addition with a positive voltage setup which is supplied by said voltage source 621 and voltage divider resistors 622 and 623.

The other terminal of each piezoelectric element 10, 20, 30, 40, 50 and 60, i.e. the group selector piezo terminal 14, 24, 34, 44, 54 resp. 64, may be connected to the plus pole of a voltage source via the group selector switch 310 resp. 320 or via the group selector diode 315 resp. 325 as well as via a coil 240 and a parallel circuit made up of a charging switch 220 and a charging diode 221, and alternatively or additionally connected to ground via the group selector switch 310 resp. 320 or via diode 315 resp. 325 as well as via the coil 240 and a parallel circuit made up of a discharging switch 230 or a discharging diode 231. Charging switch 220 and discharging switch 230 are implemented as transistors which are controlled via side drivers 222 resp. 232.

The voltage source comprises an element having capacitive properties which, in the example being considered, is the (buffer) capacitor 210. Capacitor 210 is charged by a battery 200 (for example a motor vehicle battery) and a DC voltage converter 201 downstream therefrom. DC voltage converter 201 converts the battery voltage (for example, 12 V) into substantially any other DC voltage (for example 250 V), and charges capacitor 210 to that voltage. DC voltage converter 201 is controlled by means of transistor switch 202 and resistor 203 which is utilized for current measurements taken from a measuring point 630.

For cross check purposes, a further current measurement at a measuring point 650 is allowed by activation IC E as well as by resistors 651, 652 and 653 and a 5 V DC voltage source 654; moreover, a voltage measurement at a measuring point 640 is allowed by activation IC E as well as by voltage dividing resistors 641 and 642.

Finally, a resistor 330 (referred to as total discharging resistor), a stop switch implemented as a transistor 331 (referred to as stop switch), and a diode 332 (referred to as total discharging diode) serve to discharge the piezoelectric elements 10, 20, 30, 40, 50 and 60 (if they happen to be not discharged by the "normal" discharging operation as described further below). Stop switch 331 is preferably closed after "normal" discharging procedures (cycled discharging via discharge switch 230). It thereby connects piezoelectric elements 10, 20, 30, 40, 50 and 60 to ground through resistors 330 and 300, and thus removes any residual charges that might remain in piezoelectric elements 10, 20, 30, 40, 50 and 60. The total discharging diode 332 prevents negative voltages from occurring at the piezoelectric elements 10, 20, 30, 40, 50 and 60, which might in some circumstances be damaged thereby.

Charging and discharging of all the piezoelectric elements 10, 20, 30, 40, 50 and 60 or any particular one is accomplished by way of a single charging and discharging apparatus (common to all the groups and their piezoelectric elements). In the example being considered, the common charging and discharging apparatus comprises battery 200, DC voltage converter 201, capacitor 210, charging switch 220 and discharging switch 230, charging diode 221 and discharging diode 231 and coil 240.

The charging and discharging of each piezoelectric element works the same way and is explained in the following while referring to the first piezoelectric element 10 only.

Figure 5A:
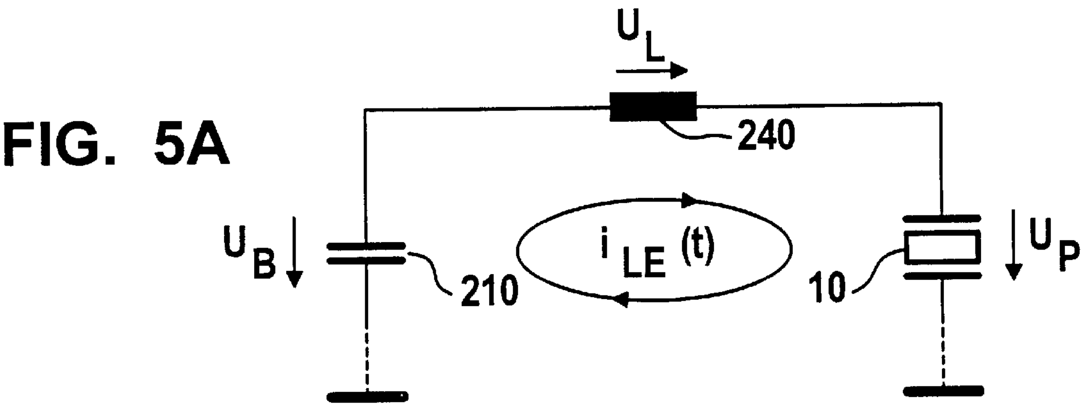
FIG. 5A shows a depiction to explain the conditions occurring during a first charging phase (charging switch 220 closed) in the circuit of FIG. 4.
Figure 5B:
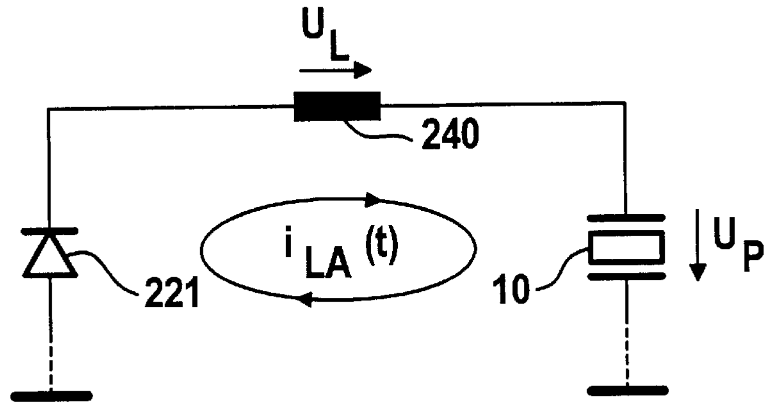
FIG. 5B shows a depiction to explain the conditions occurring during a second charging phase (charging switch 220 open again) in the circuit of FIG. 4.

The conditions occurring during the charging and discharging procedures are explained with reference to FIG. 5A through FIG. 5D, of which FIG. 5A and FIG. 5B illustrate the charging of piezoelectric element 10, and FIG. 5C and FIG. 5D the discharging of piezoelectric element 10.

The selection of one or more particular piezoelectric elements 10, 20, 30, 40, 50 or 60 to be charged or discharged, the charging procedure as described in the following as well as the discharging procedure are driven by activation IC E and control unit D by means of opening or closing one or more of the above introduced switches 11, 21, 31, 41, 51, 61; 310, 320; 220, 230 and 331. The interactions between the elements within the detailed area A on the on hand and activation IC E and control unit D on the other hand are described in detail further below.

Concerning the charging procedure, firstly any particular piezoelectric element 10, 20, 30, 40, 50 or 60 which is to be charged has to be selected. In order to exclusively charge the first piezoelectric element 10, the branch selector switch 11 of the first branch 110 is closed, whereas all other branch selector switches 21, 31, 41, 51 and 61 remain opened. In order to exclusively charge any other piezoelectric element 20, 30, 40, 50, 60 or in order to charge several ones at the same time they would be selected by closing the corresponding branch selector switches 21, 31, 41, 51 and/or 61.

Then, the charging procedure itself may take place:

Generally, within the example considered, the charging procedure requires a positive potential difference between capacitor 210 and the group selector piezo terminal 14 of the first piezoelectric element 10. However, as long as charging switch 220 and discharging switch 230 are open no charging or discharging of piezoelectric element 10 occurs: In this state, the circuit shown in FIG. 4 is in a steady-state condition, i.e. piezoelectric element 10 retains its charge state in substantially unchanged fashion, and no currents flow.

In order to charge the first piezoelectric element 10, charging switch 220 is closed. Theoretically, the first piezoelectric element 10 could become charged just by doing so. However, this would produce large currents which might damage the elements involved. Therefore, the occurring currents are measured at measuring point 620 and switch 220 is opened again as soon as the detected currents exceed a certain limit. Hence, in order to achieve any desired charge on the first piezoelectric element 10, charging switch 220 is repeatedly closed and opened whereas discharging switch 230 remains open.

In more detail, when charging switch 220 is closed, the conditions shown in FIG. 5A occur, i.e. a closed circuit comprising a series circuit made up of piezoelectric element 10, capacitor 210, and coil 240 is formed, in which a current $i_{LE}(t)$ flows as indicated by arrows in FIG. 5A. As a result of this current flow both positive charges are brought to the group selector piezo terminal 14 of the first piezoelectric element 10 and energy is stored in coil 240.

When charging switch 220 opens shortly (for example, a few μs) after it has closed, the conditions shown in FIG. 5B occur: a closed circuit comprising a series circuit made up of piezoelectric element 10, charging diode 221, and coil 240 is formed, in which a current $i_{LA}(t)$ flows as indicated by arrows in FIG. 5B. The result of this current flow is that energy stored in coil 240 flows into piezoelectric element 10. Corresponding to the energy delivery to the piezoelectric element 10, the voltage occurring in the latter, and its external dimensions, increase. Once energy transport has taken place from coil 240 to piezoelectric element 10, the steady-state condition of the circuit, as shown in FIG. 4 and already described, is once again attained.

At that time, or earlier, or later (depending on the desired time profile of the charging operation), charging switch 220 is once again closed and opened again, so that the processes described above are repeated. As a result of the re-closing and re-opening of charging switch 220, the energy stored in piezoelectric element 10 increases (the energy already stored in the piezoelectric element 10 and the newly delivered energy are added together), and the voltage occurring at the piezoelectric element 10, and its external dimensions, accordingly increase.

If the aforementioned closing and opening of charging switch 220 are repeated numerous times, the voltage occurring at the piezoelectric element 10, and the expansion of the piezoelectric element 10, rise in steps.

Once charging switch 220 has closed and opened a predefined number of times, and/or once piezoelectric element 10 has reached the desired charge state, charging of the piezoelectric element is terminated by leaving charging switch 220 open.

Concerning the discharging procedure, in the example considered, the piezoelectric elements 10, 20, 30, 40, 50 and 60 are discharged in groups (G1 and/or G2) as follows:

Firstly, the group selector switch(es) 310 and/or 320 of the group or groups G1 and/or G2 the piezoelectric elements of which are to be discharged are closed (the branch selector switches 11, 21, 31, 41, 51, 61 do not affect the selection of piezoelectric elements 10, 20, 30, 40, 50, 60 for the discharging procedure, since in this case they are bypassed by the branch diodes 12, 22, 32, 42, 52 and 62). Hence, in order to discharge piezoelectric element 10 as a part of the first group G1, the first group selector switch 310 is closed.

Figure 5C:
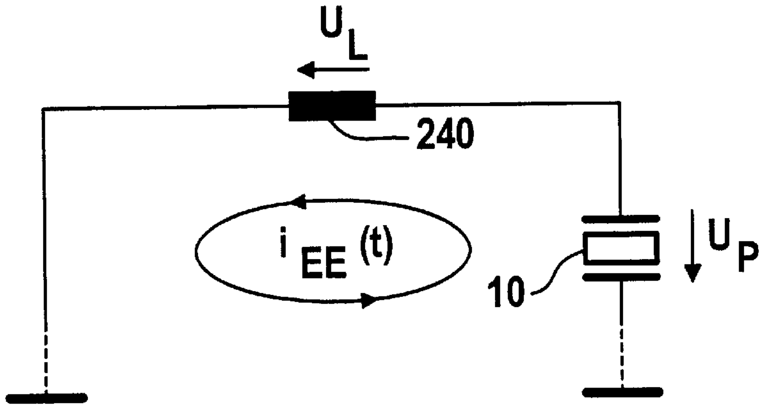
FIG. 5C shows a depiction to explain the conditions occurring during a first discharging phase (discharging switch 230 closed) in the circuit of FIG. 4.

When discharging switch 230 is closed, the conditions shown in FIG. 5C occur: a closed circuit comprising a series circuit made up of piezoelectric element 10 and coil 240 is formed, in which a current $i_{EE}(t)$ flows as indicated by arrows in FIG. 5C. The result of this current flow is that the energy (a portion thereof) stored in the piezoelectric element is transported into coil 240. Corresponding to the energy transfer from piezoelectric element 10 to coil 240, the voltage occurring at the piezoelectric element 10, and its external dimensions, decrease.

Figure 5D:
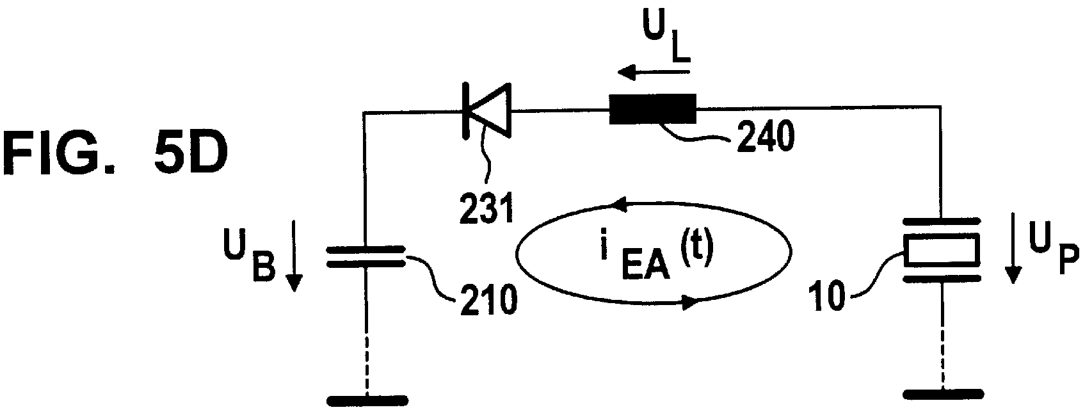
FIG. 5D shows a depiction to explain the conditions occurring during a second discharging phase (discharging switch 230 open again) in the circuit of FIG. 4.

When discharging switch 230 opens shortly (for example, a few μs) after it has closed, the conditions shown in FIG. 5D occur: a closed circuit comprising a series circuit made up of piezoelectric element 10, capacitor 210, discharging diode 231, and coil 240 is formed, in which a current $i_{EA}(t)$ flows as indicated by arrows in FIG. 5D. The result of this current flow is that energy stored in coil 240 is fed back into capacitor 210. Once energy transport has taken place from coil 240 to capacitor 210, the steady-state condition of the circuit, as shown in FIG. 4 and already described, is once again attained.

At that time, or earlier, or later (depending on the desired time profile of the discharging operation), discharging switch 230 is once again closed and opened again, so that the processes described above are repeated. As a result of the re-closing and re-opening of discharging switch 230, the energy stored in piezoelectric element 10 decreases further, and the voltage occurring at the piezoelectric element, and its external dimensions, also accordingly decrease.

If the aforementioned closing and opening of discharging switch 230 are repeated numerous times, the voltage occurring at the piezoelectric element 10, and the expansion of the piezoelectric element 10, decrease in steps.

Once discharging switch 230 has closed and opened a predefined number of times, and/or once the piezoelectric element has reached the desired discharge state, discharging of the piezoelectric element 10 is terminated by leaving discharging switch 230 open.

The interaction between activation IC E and control unit D on the one hand and the elements within the detailed area A on the other hand is performed by control signals sent from activation IC E to elements within the detailed area A via branch selector control lines 410, 420, 430, 440, 450, 460, group selector control lines 510, 520, stop switch control line 530, charging switch control line 540 and discharging switch control line 550 and control line 560. On the other hand, there are sensor signals obtained on measuring points 600, 610, 620, 630, 640, 650 within the detailed area A which are transmitted to activation IC E via sensor lines 700, 710, 720, 730, 740, 750.

The control lines are used to apply or not to apply voltages to the transistor bases in order to select piezoelectric elements 10, 20, 30, 40, 50 or 60, to perform charging or discharging procedures of single or several piezoelectric elements 10, 20, 30, 40, 50, 60 by means of opening and closing the corresponding switches as described above. The sensor signals are particularly used to determine the resulting voltage of the piezoelectric elements 10, 20 and 30, resp. 40, 50 and 60 from measuring points 600 resp. 610 and the charging and discharging currents from measuring point 620. The control unit D and the activation IC E are used to combine both kinds of signals in order to perform an interaction of both as will be described in detail now while referring to FIG. 4 and FIG. 6.

As is indicated in FIG. 4, the control unit D and the activation IC E are connected to each other by means of a parallel bus 840 and additionally by means of a serial bus 850. The parallel bus 840 is particularly used for fast transmission of control signals from control unit D to the activation IC E, whereas the serial bus 850 is used for slower data transfer.

Figure 6:
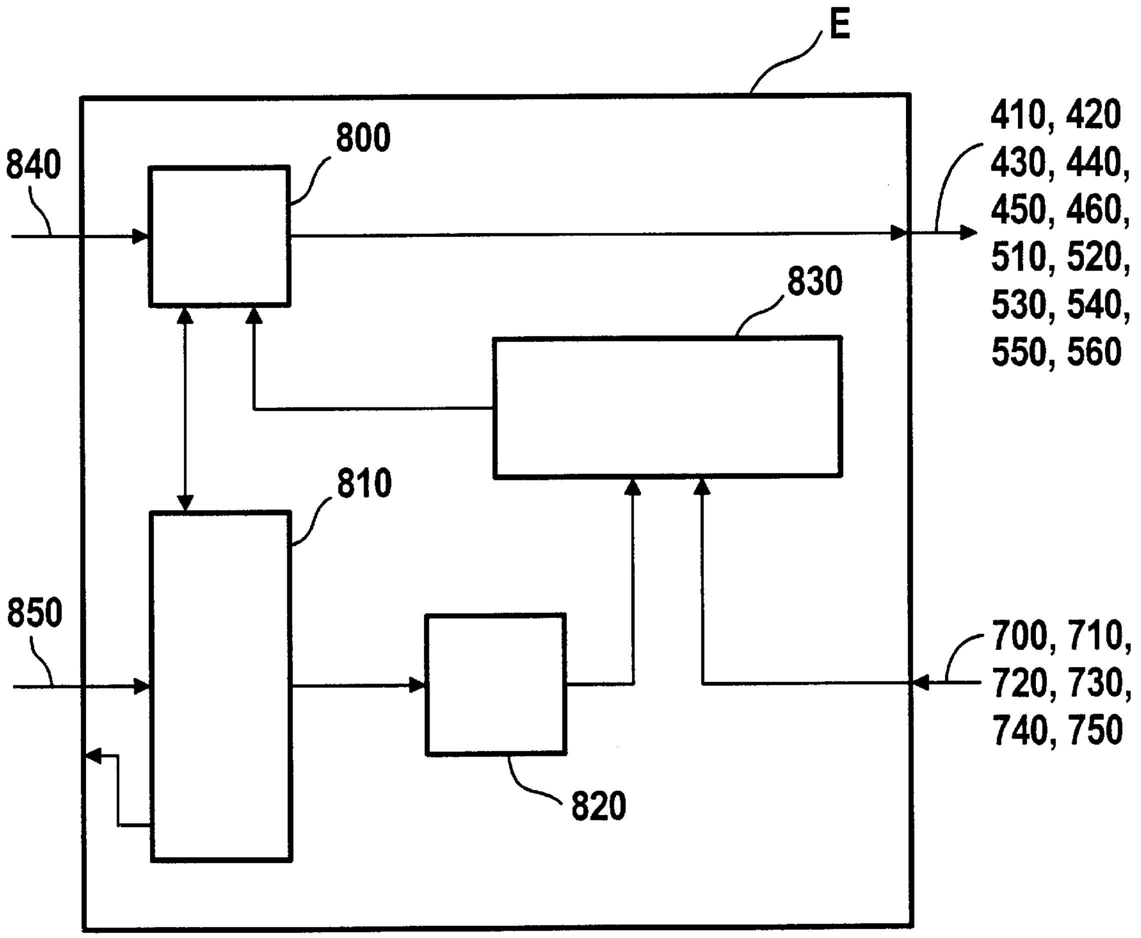
FIG. 6 shows a block diagram of components of the activation IC E which is also shown in FIG. 4.

In FIG. 6 some components are indicated, which the activation IC E comprises: a logic circuit 800, RAM memory 810, digital to analog converter system 820 and comparator system 830. Furthermore, it is indicated that the fast parallel bus 840 (used for control signals) is connected to the logic circuit 800 of the activation IC E, whereas the slower serial bus 850 is connected to the RAM memory 810. The logic circuit 800 is connected to the RAM memory 810, to the comparator system 830 and to the signal lines 410, 420, 430, 440, 450 and 460; 510 and 520; 530; 540, 550 and 560. The RAM memory 810 is connected to the logic circuit 800 as well as to the digital to analog converter system 820. The digital to analog converter system 820 is further connected to the comparator system 830. The comparator system 830 is further connected to the sensor lines 700 and 710; 720; 730, 740 and 750 and as already mentioned to the logic circuit 800.

The above listed components may be used in a charging procedure for example as follows:

By means of the control unit D a particular piezoelectric element 10, 20, 30, 40, 50 or 60 is determined which is to be charged to a certain target voltage. Hence, firstly the value of the target voltage (expressed by a digital number) is transmitted to the RAM memory 810 via the slower serial bus 850. The target voltage can be, for example, the value for $U_{opt}$ used in a main injection, as described above with respect to FIG. 1. Later or simultaneously, a code corresponding to the particular piezoelectric element 10, 20, 30, 40, 50 or 60 which is to be selected and the address of the desired voltage within the RAM memory 810 is transmitted to the logic circuit 800 via the parallel bus 840. Later on, a strobe signal is sent to the logic circuit 800 via the parallel bus 840 which gives the start signal for the charging procedure.

The start signal firstly causes the logic circuit 800 to pick up the digital value of the target voltage from the RAN memory 810 and to put it on the digital to analog converter system 820 whereby at one analog exit of the converters 820 the desired voltage occurs. Moreover, said analog exit (not shown) is connected to the comparator system 830. In addition hereto, the logic circuit 800 selects either measuring point 600 (for any of the piezoelectric elements 10, 20 or 30 of the first group G1) or measuring point 610 (for any of the piezoelectric elements 40, 50 or 60 of the second group G2) to the comparator system 830. Resulting thereof, the target voltage and the present voltage at the selected piezoelectric element 10, 20, 30, 40, 50 or 60 are compared by the comparator system 830. The results of the comparison, i.e. the differences between the target voltage and the present voltage, are transmitted to the logic circuit 800. Thereby, the logic circuit 800 can stop the procedure as soon as the target voltage and the present voltage are equal to one another.

Secondly, the logic circuit 800 applies a control signal to the branch selector switch 11, 21, 31, 41, 51 or 61 which corresponds to any selected piezoelectric element 10, 20, 30, 40, 50 or 60 so that the switch becomes closed (all branch selector switches 11, 21, 31, 41, 51 and 61 are considered to be in an open state before the onset of the charging procedure within the example described). Then, the logic circuit 800 applies a control signal to the charging switch 220 so that the switch becomes closed. Furthermore, the logic circuit 800 starts (or continues) measuring any currents occurring on measuring point 620. Hereto, the measured currents are compared to any predefined maximum value by the comparator system 830. As soon as the predefined maximum value is achieved by the detected currents, the logic circuit 800 causes the charging switch 220 to open again.

Again, the remaining currents at measuring point 620 are detected and compared to any predefined minimum value. As soon as said predefined minimum value is achieved, the logic circuit 800 causes the charging switch 220 to close again and the procedure starts again.

The closing and opening of the charging switch 220 is repeated as long as the detected voltage at measuring point 600 or 610 is below the target voltage. As soon as the target voltage is achieved, the logic circuit stops the continuation of the procedure.

The discharging procedure takes place in a corresponding way: Now the selection of the piezoelectric element 10, 20, 30, 40, 50 or 60 is obtained by means of the group selector switches 310 resp. 320, the discharging switch 230 instead of the charging switch 220 is opened and closed and a predefined minimum target voltage is to be achieved.

The timing of the charging and discharging operations and the holding of voltage levels in the piezoelectric elements 10, 20, 30, 40, 50 or 60 depends on the corresponding valve stroke to realize a certain injection, as shown, for example, in FIGS. 2A and 2B.

It is to be understood that the above given description of the way charging or discharging procedures take place are exemplary only. Hence, any other procedure which utilizes the above described circuits or other circuits might match any desired purpose and any corresponding procedure may be used in place of the above described example.

As described above, in the present example, rail pressures are measured by the measuring system F and the measured values are communicated to the control unit D. Within control unit D, the measured values are utilized in calculating control parameters corresponding to target activation voltage values which are to be applied to the individual piezoelectric elements 10, 20, 30, 40, 50 or 60.

The rail pressure which is taken into account is changing quite rapidly (for example up to 2000 bar/sec) and hence the time gap between a measurement and the application of corresponding control parameters to any piezoelectric element 10, 20, 30, 40, 50 or 60 should be relatively small. On the other hand, the serial bus system 850, by which the control parameters are transmitted from the control unit D to the activation IC E, is relatively slow (as an example, the transmission of 16 Bit takes sixteen times as long as it would take while using a corresponding parallel bus). Hence, there is a need to perform a control which is as close to real time as possible.

Figure 7:
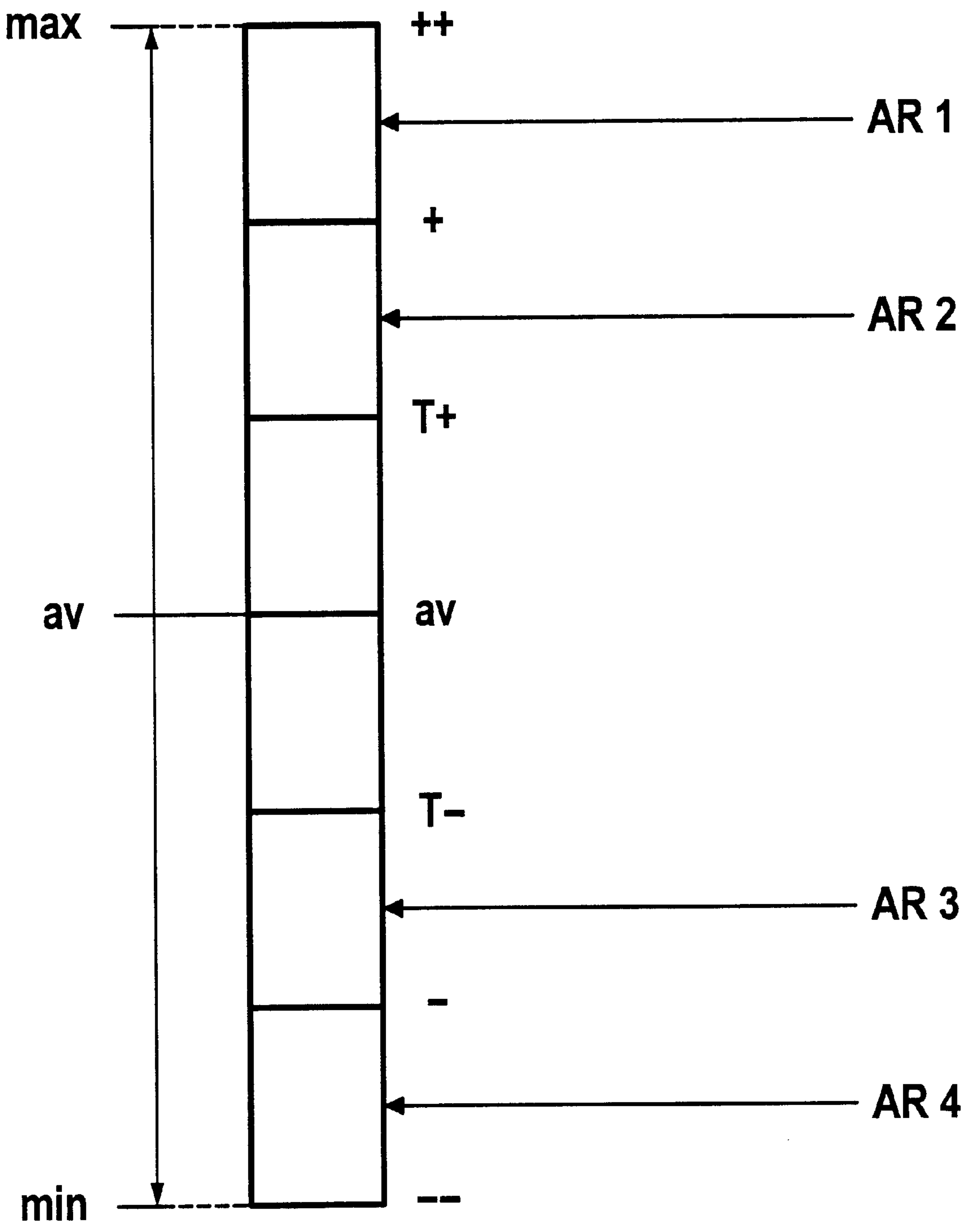
FIG. 7 shows a depiction of offsets for control parameters corresponding to a base target voltage which are required in order to match activation voltages for piezoelectric element to rail pressure changes, according to the present invention.
Figure 8:
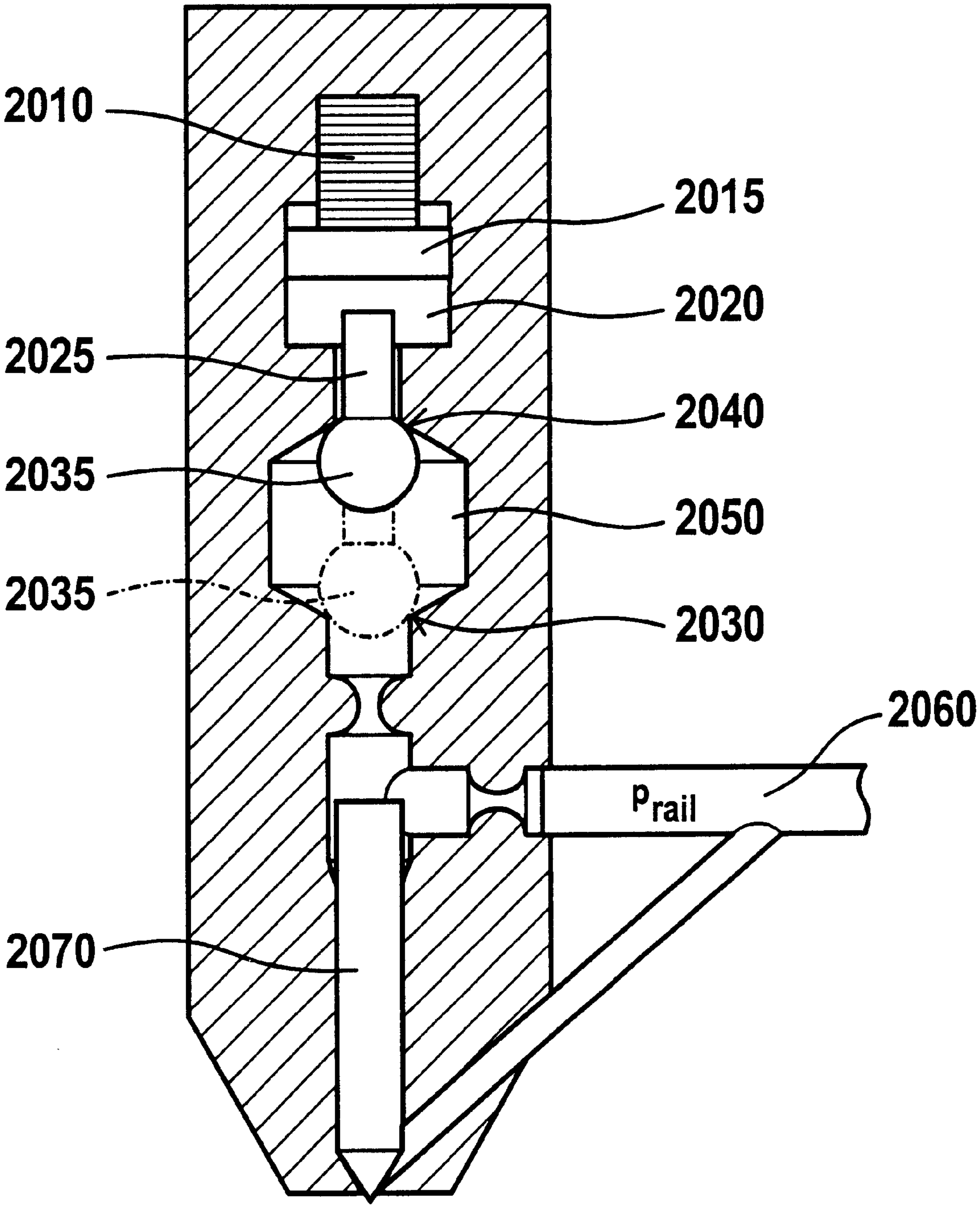
FIG. 8 shows a schematic representation of a fuel injection system using a piezoelectric element as an actuator.

For this reason, the rail pressure is repeatedly measured by measuring system F during an observation period in advance of a fuel injection. As an example, the observation period might last 10 msec and the measurements are taken after each 1 msec, i.e. 10 values are obtained. From this, as is illustrated in FIG. 7, a maximum (max), a minimum (min) and an average (av) rail pressure are obtained. Furthermore, the range between the maximum and the minimum pressure is subdivided corresponding to any eligible linear or non-linear scale (indicated as ++, +, T+, 0, T−, −, −−).

Then, several target voltages for the piezoelectric elements 10, 20, 30, 40, 50 and 60 are calculated within the control unit D. While doing so, in addition to the rail pressure further parameters can be taken into account, such as, for example, the temperature of each individual piezoelectric element 10, 20, 30, 40, 50 or 60. Since in particular the temperature of the individual piezoelectric elements 10, 20, 30, 40, 50 and 60 varies, whereas the rail pressure within a common rail system is for all piezoelectric elements 10, 20, 30, 40, 50 and 60 basically the same (i.e. occurring relative differences are adjusted by constructive means), on the one hand, there is an individual base target voltage calculated for each individual piezoelectric element 10, 20, 30, 40, 50 and 60, while taking into account the average rail pressure which is indicated by av. On the other hand, there are common offsets V++, V+, VO, V− and V−− calculated which need to be added to any of the individual base target voltages in order to make them corresponding to measured rail pressures above or below the average rail pressure av.

In more detail, each offset value corresponds to one pressure value on the scale of pressure values, as is illustrated in FIG. 7. Since small deviations from the average pressure value can be neglected, there are no offsets calculated for pressure values which are equal to or between tolerance values T+, T−. Instead, in these cases, a zero offset V0 is used. For larger deviations, in the example considered, there are two offsets V+, V++ calculated which correspond to medium positive or maximum deviations (+,++) and two offsets V−, V−−, which correspond to medium negative or minimum deviations (−, −−), respectively. However, in order to achieve a higher or lower precision, more or less offsets can be calculated.

Later or in parallel hereto, all the control parameters corresponding to the base target voltages as well as to the offsets are transmitted to the RAM memory 810 within the activation IC E by means of the serial bus system 850. As a result, within the activation IC E there are control parameters available, from which by means of addition control parameters can be obtained which more or less match any rail pressure within a given range.

Now, in order to control a fuel injection, shortly before the injection the current rail pressure is measured by the measuring system F. Then, in order to select the right offset, the current rail pressure is compared to the rail pressure values corresponding to each individual offset V++, V+, V0, V− and V−−, and the particular offset V++, V+, V0, V− or V−− is selected, the corresponding rail pressure value of which is the closest one to the current rail pressure value. Hence, for any current rail pressure above the AR1 arrow (indicating the middle between pressure values + and ++) in FIG. 7, the offset V++ corresponding to the maximum pressure ++ is selected; for any pressure between arrow AR1 and arrow AR2 the offset V+ corresponding to the medium positive pressure + is selected; for any pressure between arrow AR2 and arrow AR3 the zero offset V0 is selected and so on.

Then, within the control unit D selection parameters corresponding to the particular piezoelectric element 10, 20, 30, 40, 50 or 60, which is used, selection parameters corresponding to its individual base target voltage and selection parameters corresponding to the offset V++, V+, V0, V− or V−− which matches best to the current rail pressure are determined and transmitted to the logic circuit 800 within the activation IC E via the parallel bus system 840.

Finally, within the activation IC E, the selection parameters are utilized in order to select the piezoelectric element 10, 20, 30, 40, 50 or 60 and to select the appropriate control parameters for the selected piezoelectric element 10, 20, 30, 40, 50 or 60. The selected offset V++, V+, V0, V− or V−− is added to the base control parameter (i.e. voltage corresponding to the average rail pressure) by addition means (not shown). Then, the resulting voltage is applied to the selected piezoelectric element 10, 20, 30, 40, 50 or 60, as described above, to achieve an accurate expansion or contraction of the selected piezoelectric element 10, 20, 30, 40, 50 or 60.

Compared with storing a set of voltages individually for each cylinder and activation voltage level, this method has the advantage that the amount of data is reduced and therefore the storage capacity within the activation IC E, and thus costs, are also reduced. For example, in order to take into account quick changes in the rail pressure, an engine having 6 cylinders and 2 different valve displacement positions per fuel injector (i.e. double acting valve), must be able to store five different voltage values (V−−, V−, V0, V+, V++), for each cylinder and valve displacement position. Thus 60 storage cells are required (6*2*5=60). On the other hand, using a method in which only the base value is tracked and adjusted by adding one of four voltage offsets (V−−, V−, V+, and V++), for example, the same engine would only require 16 storage cells: (6*2*1+4).

What is claimed is:

1. An apparatus for charging a piezoelectric element (10, 20, 30, 40, 50 or 60) of a fuel injection system, characterized in that an activation voltage value for charging the piezoelectric element (10, 20, 30, 40, 50 or 60) is set as a function of a measured operating characteristic of the fuel injection system and in that the activation voltage is calculated by adding an offset voltage to a base voltage value.

2. The apparatus as defined in claim 1, characterized in that the measured operating characteristic is a measured fuel pressure and/or a system temperature in the fuel injection system.

3. The apparatus as defined in claim 2, characterized in that a memory stores a set of activation voltage values, each corresponding to a fuel pressure range, for charging the piezoelectric element (10, 20, 30, 40, 50 or 60).

4. The apparatus as defined in claim 3, characterized in that a control means selects one of the activation voltage levels for charging the piezoelectric element (10, 20, 30, 40, 50 or 60) as a function of a current measured fuel pressure.

5. A method for charging a piezoelectric element (10, 20, 30, 40, 50 or 60) of a fuel injection system, characterized in that a definition is made, prior to charging, as to a value for an activation voltage for charging the piezoelectric element (10, 20, 30, 40, 50 or 60), as a function of a measured operating characteristic of the fuel injection system and in that the activation voltage is calculated by adding an offset voltage to a base voltage value.

6. The method as defined in claim 5 characterized in that the measured operating characteristic is a measured fuel pressure and/or a system temperature in the fuel injection system.

7. The method as defined in claim 5 characterized in that a set of activation voltage values are stored, each corresponding to a fuel pressure range, for charging the piezoelectric element (10, 20, 30, 40, 50 or 60).

8. The method as defined in claim 5 characterized in that one of the set of activation voltage values is selected for charging the piezoelectric element (10, 20, 30, 40, 50 or 60) as a function of a current measured fuel pressure.

9. The method as defined in claim 5 characterized in that the offset voltage value is calculated based on a system parameter.

10. The method as defined in claim 9 characterized in that the system parameter includes a temperature and/or a rail pressure.

11. An apparatus for charging a piezoelectric element of a fuel injection system, comprising:

a first arrangement configured to set an actuation voltage value for charging the piezoelectric element as a function of a measured operating characteristic of the fuel injection system; and a second arrangement configured to calculate the activation voltage by adding an offset voltage value to a base voltage value.

12. The apparatus as defined in claim 11, wherein the measured operating characteristic includes at least one of a measured fuel pressure and a system temperature in the fuel injection system.

13. The apparatus as defined in claim 12, further comprising a memory configured to store a set of activation values for charging the piezoelectric element, each activation value corresponding to a fuel pressure range.

14. The apparatus as defined in claim 13, further comprising an arrangement configured to select one of the activation voltage values for charging the piezoelectric element as a function of a current measured fuel pressure.

15. A method for charging a piezoelectric element of a fuel injection system, comprising the steps of:

prior to charging, defining a value for an activation voltage for charging the piezoelectric element as a function of a measured operating characteristic of the fuel injection system; and calculating the activation voltage by adding an offset voltage value to a base voltage value.

16. The method as defined in claim 15, wherein the measured operating characteristic includes at least one of a measured fuel pressure and a system temperature in the fuel injection system.

17. The method as defined in claim 15, further comprising the step of storing a set of activation voltage values for charging the piezoelectric element, each activation voltage value corresponding to a fuel pressure range.

18. The method as defined in claim 17, further comprising the step of selecting one of the set of activation voltage values for charging the piezoelectric element as a function of a current measured fuel pressure.

19. The method as defined in claim 15, further comprising the step of calculating the offset voltage value in accordance with a system parameter.

20. The method as defined in claim 19, wherein the system parameter includes at least one of a temperature and a rail pressure.

* * * * *

UNITED STATES PATENT AND TRADEMARK OFFICE

CERTIFICATE OF CORRECTION

PATENT NO. : 6,509,672 B2 Page 1 of 1
DATED : January 21, 2003
INVENTOR(S) : Johannes-Jörg Rueger et al.

It is certified that error appears in the above-identified patent and that said Letters Patent is hereby corrected as shown below:

Column 4,
Line 45, delete "upper"
Line 47, delete "lower"

Column 11,
Line 47, change "RAN" to -- RAM --

Column 13,
Line 2, change "–,—" to -- —,— — --
Lines 17, 30, 47 and 62 change "V—" to -- V — — --

Column 14,
Line 3, 18 and 22 change "V—" to -- V— — --

Signed and Sealed this

Eighteenth Day of May, 2004

JON W. DUDAS
*Acting Director of the United States Patent and Trademark Office*